United States Patent [19]
Jonker

[11] Patent Number: 5,874,749
[45] Date of Patent: Feb. 23, 1999

[54] POLARIZED OPTICAL EMISSION DUE TO DECAY OR RECOMBINATION OF SPIN-POLARIZED INJECTED CARRIERS

[75] Inventor: Berend T. Jonker, Bowie, Md.

[73] Assignee: The United States of America as represented by the Secretary of the Navy, Washington, D.C.

[21] Appl. No.: 83,231

[22] Filed: Jun. 29, 1993

[51] Int. Cl.$^6$ .................................................. H01L 33/00
[52] U.S. Cl. ............................ 257/98; 257/99; 257/424; 257/427
[58] Field of Search ............................... 257/79, 94, 108, 257/425, 103, 99, 44, 424, 427, 98

[56] References Cited

U.S. PATENT DOCUMENTS 4,823,177  4/1989  Prinz et al. ............................. 257/421

OTHER PUBLICATIONS

Datta et al., "Electronic analog of the electro-optic modulator", Applied Physics Letters 56 (7) pp. 665–667 (Feb. 12, 1990).

Johnson et al., "Interfacial Charge-Spin Coupling: Injection and Detection of Spin Magnetization in Metals", Physical Rev. Letters 55 (17) pp. 1790–1793 (Oct. 21, 1985).

IBM Tech. Disc, Bull., "Imaging Magnetic Domains on Ferromagnetic Thin Film . . ."vol. 33, No. 11, Apr. 1991, pp 469–472.

Primary Examiner—Sara Crane
Attorney, Agent, or Firm—Thomas E. McDonnell; John J. Karasek

[57] ABSTRACT

A device for producing circularly polarized optical emission includes a light emitting semiconductor heterostructure, further including at least one semiconducting layer; a ferromagnetic contact having a magnetic moment, in electrical contact with a layer of the semiconductor heterostructure; and a contact electrically connected to a different region of the semiconductor heterostructure. This light emitting semiconductor heterostructure may be a light emitting diode (LED), or some other structure. The ferromagnetic contact injects spin polarized carriers (electrons or holes) into the semiconducting device, which recombine with their opposing carriers to produce circularly polarized light. A process for producing circularly polarized optical emission includes applying a bias across a light emitting semiconductor heterostructure having a contact with a net magnetic moment, therby injecting spin polarized carriers into the light emitting semiconductor heterostructure.

20 Claims, 3 Drawing Sheets

POLARIZED OPTICAL EMISSION DUE TO DECAY OR RECOMBINATION OF SPIN-POLARIZED INJECTED CARRIERS

BACKGROUND OF THE INVENTION

1. Field of the Invention

This invention relates to light emitting semiconductor devices and processes, and more particularly to light emitting semiconductor devices and processes that use spin-polarized carriers to produce circularly polarized light.

2. Description of the Related Art

Circularly polarized light, especially modulated (i.e. pulsed) circularly polarized light, is useful in optical switching and optical computing applications.

It is known that a light emitting diode (LED) emits unpolarized light and that a quarter wave plate may be used to filter this light to produce circularly polarized light. However, attaching this additional component on or adjacent to an LED requires an additional manufacturing step, and increases the size of the component.

Skilled practitioners in the art will recognize that FIG. 1 shows a typical known LED structure 10 for producing unpolarized light. This LED structure 10 has at least one n-doped semiconductor layer 12 adjacent to at least one p-doped semiconductor layer 13 to form a p-n junction. This p-n junction is usually disposed on a semiconducting substrate 14. This structure is connected to a voltage source 16 through a pair of electrical contacts 11. Positioned in the path of light emitted from this structure is a quarter wave plate 15.

In operation, when a voltage is applied to this LED structure 10 through the contacts 11, electrons will be injected into the p-n junction from one direction, while holes will be injected into the p-n junction from the opposite direction. These electrons and holes will recombine or decay to produce unpolarized photons. When this unpolarized light passes through the quarter wave plate 15, it emerges as circularly polarized light.

SUMMARY OF THE INVENTION

Accordingly, it is an object of this invention to radiate circularly polarized light directly from a light emitting semiconductor device, such as an LED or other semiconducting heterostructure, without the need for a quarter wave plate or other structure for polarizing the light emitted by the light emitting semiconductor device.

It is a further object of this invention to radiate modulated circularly polarized light from this structure.

These and additional objects of the invention are accomplished by the structures and processes hereinafter described.

A device for producing circularly polarized optical emission includes a light emitting semiconductor heterostructure, further including at least one semiconducting layer; a contact having a net magnetic moment, in electrical contact with a layer of the semiconductor heterostructure; and a contact electrically connected to a different region of the semiconductor heterostructure.

A process for producing circularly polarized optical emission includes applying a bias across a light emitting semiconductor heterostructure having a contact with a net magnetic moment, thereby injecting spin polarized carriers into the light emitting semiconductor heterostructure.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS OF THE INVENTION

Figure 1:
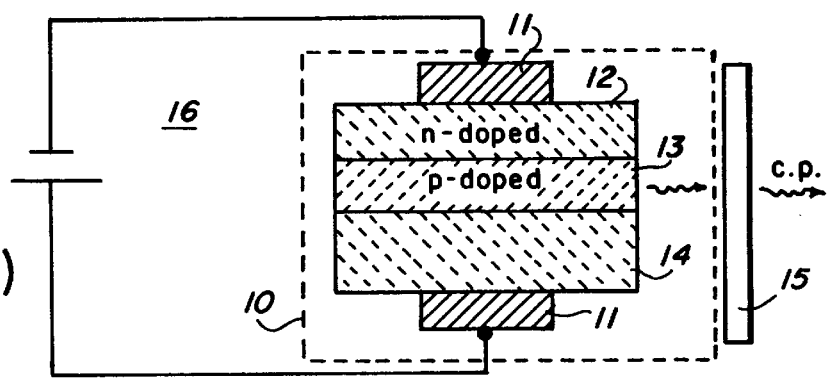
FIG. 1 shows a known structure for producing circularly polarized light.
Figure 2:
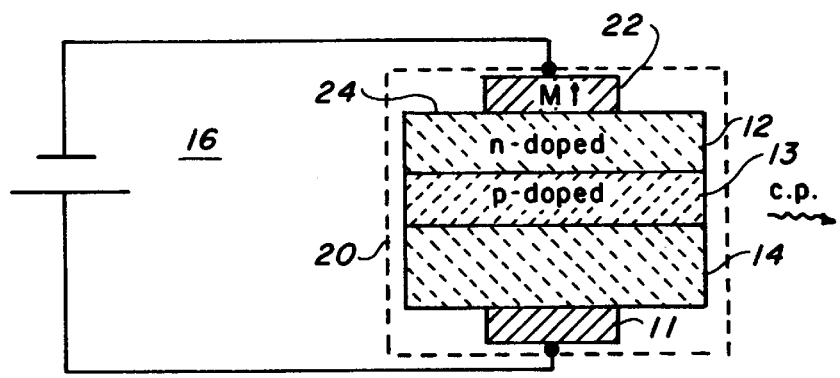
FIG. 2 shows a novel structure for producing circularly polarized light.

As shown in FIG. 2, the present invention replaces one of the electrical contacts 11 on the light emitting semiconductor device 20 with a contact 22 having a net magnetic moment. In operation, when a voltage is applied to this light emitting semiconductor device 20, spin polarized carriers (electrons or holes) are transported as electrical current into the semiconductor structure. The spin polarized carriers (electrons or holes) recombine with their opposing carriers (holes or electrons) to produce light with a net circular polarization, as a consequence of the selection rules which describe such recombination processes and the relative magnitudes of the hole density of states (light hole $m_{j_{lh}}=\pm\frac{1}{2}$, heavy hole $m_{j_{hh}}=\pm\frac{3}{2}$). The allowed radiative recombination processes of interest are those between an electron ($m_{je}=\pm\frac{1}{2}$) and a hole ($m_{jh}=\pm\frac{1}{2}, \pm\frac{3}{2}$) such that $\Delta m_j=m_{je}-m_{jh}=\pm 1$. Other transitions do not result in the emission of circularly polarized light, however $\Delta m_j=0$ results in the emission of linearly polarized light.

Figure 3A:
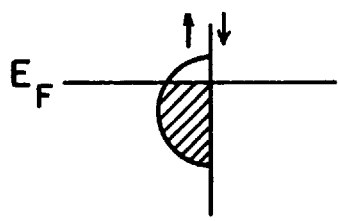
FIGS. 3A and 3B show, respectively, ideal and typical electron spin subbands for a magnetic contact.
Figure 3B:
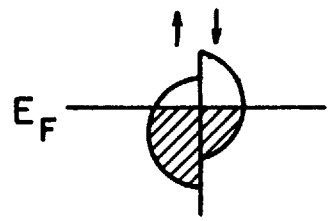

This magnetic contact 22 may have its magnetic moment oriented at any angle with respect to the semiconductor surface 24. Preferably, the magnetic moment of the magnetic contact 22 is oriented essentially perpendicular to the light emitting semiconductor surface 24, as shown in FIG. 2. This orientation will optimize the net circular polarization of the emitted light resulting from the recombination of spin-polarized carriers injected into the light emitting semiconductor device. Ideally, the Fermi level in the magnetic contact intersects only one spin subband, as shown in FIG. 3A. Typically, this is not achievable for most magnetic materials, so in practice the Fermi level intersects both spin bands, but in a manner which results in a substantial imbalance between the filled spin-up versus spin-down electron states, as shown in FIG. 3B.

Any material which will provide a source of spin polarized carriers (electrons or holes) under suitable bias will serve as the magnetic contact 22. Preferably, the magnetic contact is MnGa, EuO, MnAl, CoPt, or hcp Co (hexagonal close packed cobalt). The magnetic contact 22 must be thick enough to establish a net magnetic moment, e.g. between about 10 Å and about 1 µm thick. The magnetic contact may be deposited by standard techniques.

Preferably, the magnetic contact 22 forms an ohmic contact with the surface 24 of the light emitting semiconductor heterostructure. Alternatively, the magnetic contact 22 may form a Schottky barrier contact with the semiconductor surface 24, so that a higher voltage must be applied to transport the spin polarized carriers into the light emitting semiconductor device, and an avalanche or tunnelling process may be involved as well.

Figure 4:
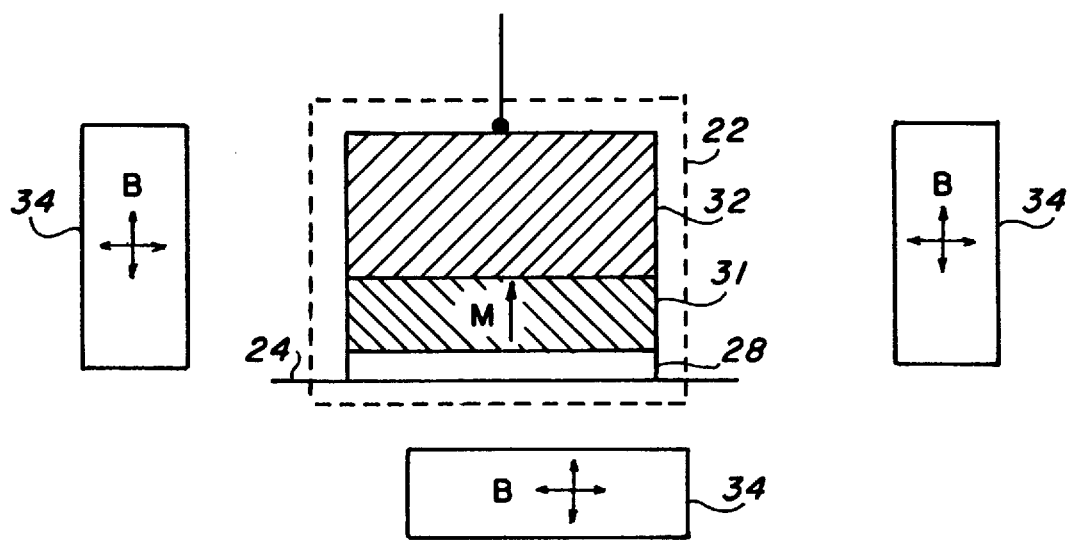
FIG. 4 shows a preferred magnetic contact for transporting spin polarized carriers into a semiconducting device.

FIG. 4 shows an exemplary magnetic contact 22. This contact has a thin "seed" layer 28 interposed between the magnetic material 31 and the top semiconductor surface 24, for stabilizing growth of the magnetic material 31, and for acting as a chemical diffusion barrier. Selection of a seed material will be governed by the selection of the magnetic material 31 and the top semiconductor surface 24, as skilled practitioners will recognize.

Another feature of this preferred magnetic contact is a capping layer 32 over the magnetic material 31, for retarding oxidation (in the operating environment) or facilitating wire bonding-contact. A preferred capping layer 32 material is gold.

The magnetic layer 31 in the contact 22 may have a magnetic moment without an applied magnetic field, as in a ferromagnet (remnant magnetization), or it may have a net magnetic moment only in an applied magnetic field. In the case where the presence or absence of the net magnetic moment in the magnetic layer 31 depends on whether there is an applied magnetic field, the emission of circularly polarized light may be modulated by means 34 for applying a magnetic field to the contact 22.

The magnetizing means 34 may be an external source of static or modulated magnetic field, e.g. an electromagnet or recorded bits on magnetic recording media. The direction of this external field may be perpendicular or parallel to the surface 24. If perpendicular to the surface, reversing the direction of the applied field to reverse the direction of the moment M (so that it point either to towards or away from the surface), will result in reversing the sense of the circularly polarization. If the applied field is parallel to the surface and strong enough to cause the perpendicular moment M to lie parallel to the surface, then the emitted circularly polarized light will be quenched.

Figure 5A:
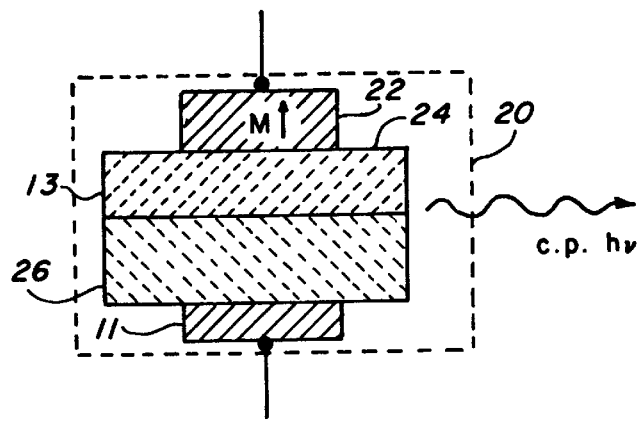
FIGS. 5A, 5B, and 5C show several preferred novel structures for producing circularly polarized light.
Figure 5B:
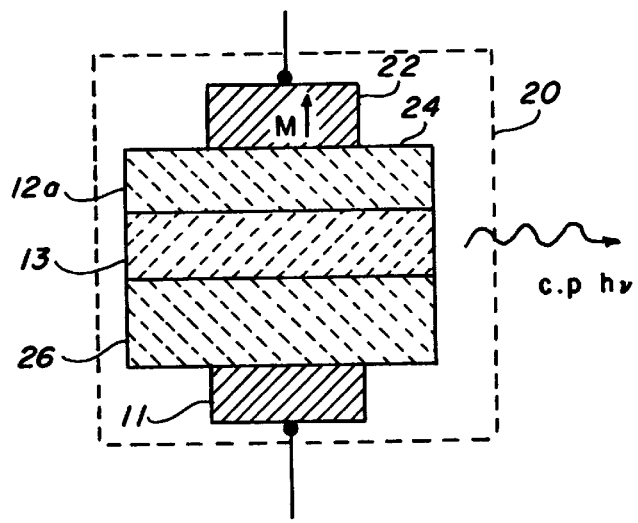
Figure 5C:
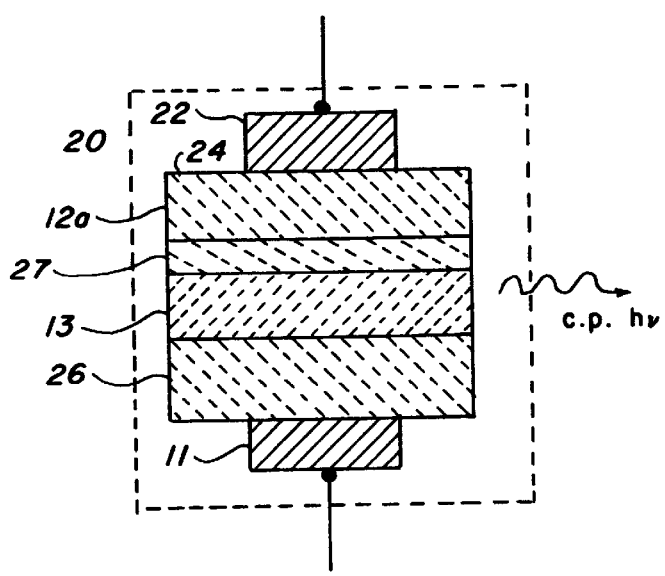

The light emitting semiconductor device 20 may be any semiconductor device that will emit circularly polarized light upon the injection of spin-polarized carriers. The structure may have several doped or undoped semiconductor layers (doped layers are defined herein to be layers having carrier concentrations $>\approx 10^{15}$/cc; undoped layers are defined herein to be layers having carrier concentrations $\leq \approx 10^{15}$/cc). The structure 20 may take the form of the prototypical LED having a single p-n junction, as shown in FIG. 2. The device may alternatively take the form of a more complex structure such as a solid state semiconductor laser, or a two dimensional electron gas device. The structure may also assume a simpler form such as a magnetic contact 22 on a suitably doped semiconductor layer, i.e. the structure may lack a p-n junction. FIGS. 5A through 5C show several preferred embodiments of the invention.

FIG. 5A shows a preferred light emitting semiconductor device 20 lacking a p-n junction. This device 20 has a p-doped layer 13 over a p-doped substrate 26. A magnetic contact 22 is attached to the p-doped layer 13, and an ohmic contact 11 is attached to the substrate 26. The p-doped overlayer 13 and the p-doped substrate 26 may comprise the same or different materials.

FIG. 5B shows another preferred light emitting semiconductor device. This device has a p-doped layer 13 over a p-doped substrate 26. Over this p-doped layer is another semiconducting layer 12a, which may be n-doped or undoped. A magnetic contact 22 is attached to the n-doped or undoped layer 12a, and an ohmic contact 11 is attached to the substrate 26. There are several variations to this preferred embodiment of the invention. In one preferred embodiment, all three semiconducting layers 12a,13,26 comprise the same semiconducting material. In another preferred embodiment, all three semiconducting layers 12a, 13,26 comprise different semiconducting materials. In other preferred embodiments, the substrate layer 26, the p-doped layer 13, or the layer 12a in contact with the magnetic contact 22 may comprise one semiconducting material while the other layers comprise a second semiconducting material.

FIG. 5C shows another preferred light emitting semiconductor device. This device has a p-doped layer 13 over a p-doped substrate 26. Over this p-doped layer 13 is a semiconducting quantum well layer 27, which may be doped or undoped, and which may comprise a different semiconducting material than the p-doped layer 13. This quantum well layer is described in greater detail infra. Over this quantum well layer 26a is another semiconducting layer 12a which may be n-doped or undoped. A magnetic contact 22 is attached to the n-doped or undoped layer 12a, and an ohmic contact 11 is attached to the substrate 26.

Preferably, the light emitting semiconductor device structure 20 is an archetypical LED having a p-doped layer 13 and an n-doped or undoped layer 12a. More preferably, as exemplified in FIG. 5C, the LED 20 will have a strained quantum well layer 27 between the p-doped layer 13 and the n-doped or undoped layer 12a. This quantum well layer 27 may be selected from any of the semiconductor families, e.g. III–V semiconductors, IV–VI semiconductors, and II–VI semiconductors. One preferred formula for this strained layer is:

where x is between about 0.03 and 1.0, and where the barrier layers 12,13 are GaAs. Skilled practitioners will recognize that this strained quantum well layer 27 provides a region of enhanced probability of finding electrons and holes, thereby increasing the recombination rate of the electrons and holes. This strained layer 27 also provides splitting of the valence or hole bands ($m_j = \pm 3/2, \pm 1/2$) into light hole and heavy hole levels, i.e. the valence band is non-degenerate. This splitting enhances the net circular polarization of the light emitted from the structure.

The remaining electrical contact 11 need not be magnetic. It should, however, provide a good ohmic contact to the substrate 14,26.

The structures shown in, e.g., FIGS. 2 and 5A are configured for spin polarized electron injection from the magnetic contact 22. For spin polarized hole injection from this contact 22, the n-doped layer and p-doped layer are preferably reversed.

Having described the invention, the following example is given to illustrate specific applications of the invention, including the best mode now known to perform the invention. This specific example is not intended to limit the scope of the invention described in this application.

EXAMPLE 1

Deposit a 1 μm layer of p⁺-doped GaAs on a 0.5 mm thick p⁺-doped GaAs substrate by molecular beam epitaxy or a CVD-type process. Deposit a 100 Å strained layer of $Ga_{0.9}In_{0.1}As$ on this p₊-doped GaAs layer. Deposit a 100 Å layer of n-doped or undoped GaAs on this 100 Å strained layer. Attach a 500 Å thick ferromagnetic contact of MnGa or MnAl to this n-doped or undoped GaAs layer, with the magnetic moment of the contact perpendicular to the layer. Attach an ohmic contact (e.g. indium) to the GaAs substrate. Attach leads to the two contacts, and apply a bias of about 1 V to these contacts. Position an analyzer to intercept light from the structure distinguish circularly polarized light.

Obviously, many modifications and variations of the present invention are possible in light of the above teachings. It is therefore to be understood that, within the scope of the appended claims, the invention may be practiced otherwise than as specifically described.

What is claimed is:

1. A device for producing polarized optical emission, comprising:
   a semiconducting heterostructure, further comprising at least one doped semiconducting layer;
   a contact having a net magnetic moment, in electrical contact with a region of said semiconducting heterostructure;
   a contact electrically connected to a different region of said semiconducting heterostructure;
   wherein said at least one doped layer is a strained layer.

2. A device for producing polarized optical emission, comprising:
   a semiconducting heterostructure, further comprising at least one doped semiconducting layer;
   a contact having a net magnetic moment, in electrical contact with a region of said semiconducting heterostructure;
   a contact electrically connected to a different region of said semiconducting heterostructure;
   wherein said device comprises at least two semiconducting layers, and wherein a first of said at least two semiconducting layers is a p-doped layer and wherein a second of said at least two semiconducting layers is an n-doped or undoped layer.

3. The device of claim 2, wherein said magnetic contact comprises at least one layer of magnetic material and at least one layer of capping material over said layer of magnetic material.

4. The device of claim 2, wherein the magnetic moment of said magnetic contact is essentially perpendicular to said semiconducting layer.

5. The device of claim 2, wherein said magnetic contact comprises at least one layer of magnetic material and at least one layer of seed material between said layer of magnetic material and said semiconducting layer.

6. The device of claim 2, wherein said magnetic contact is in ohmic contact with said semiconducting heterostructure.

7. The device of claim 2, wherein said magnetic contact forms a Schottky barrier contact with said semiconducting heterostructure.

8. The device of claim 2, wherein said at least one doped layer is a strained layer having sufficient crystalline lattice distortion to measurably split the corresponding valence band energy levels.

9. The device of claim 2, further comprising a quantum well layer between said first of said at least two semiconducting layers and said second of said at least two semiconducting layers.

10. The device of claim 9, wherein the magnetic moment of said magnetic contact is essentially perpendicular to said semiconducting layer.

11. The device of claim 9, wherein said magnetic contact comprises at least one layer of magnetic material and at least one layer of capping material over said layer of magnetic material.

12. The device of claim 9, wherein said magnetic contact comprises at least one layer of magnetic material and at least one layer of seed material between said layer of magnetic material and said semiconducting layer.

13. The device of claim 9, wherein said magnetic contact is in ohmic contact with said semiconducting heterostructure.

14. The device of claim 9, wherein said magnetic contact forms a Schottky barrier contact with said semiconducting heterostructure.

15. The device of claim 9, wherein said quantum well layer is a strained layer having sufficient crystalline lattice distortion to measurably split the corresponding valence band energy levels.

16. The device of claim 8, wherein said device comprises:
   an ohmic contact layer;
   a p-doped GaAs substrate layer over and electrically contacted to said ohmic contact layer;
   a p-doped GaAs layer over said p-doped GaAs substrate layer;
   a semiconducting strained quantum well layer;
   an n-doped or undoped GaAs layer over said quantum well layer; and
   a magnetic contact layer over said n-doped or undoped GaAs layer having a magnetic moment essentially perpendicular to said n-doped GaAs layer.

17. The device of claim 16, wherein said semiconducting strained quantum well layer has the formula:

$$Ga_xIn_{1-x}As$$

wherein x is between 0.03 and 1.0.

18. The device of claim 16, further comprising means for biasing said contact layers.

19. A method for producing circularly polarized optical emission, comprising the step of applying a bias across a semiconducting heterostructure through a magnetic contact having a net magnetic moment, thereby injecting spin polarized carriers into said semiconducting heterostructure for recombination to produce circularly polarized light, wherein said semiconducting heterostructure has a strained layer.

20. A method for producing circularly polarized optical emission, comprising the step of applying a bias across a semiconducting heterostructure through a magnetic contact having a net magnetic moment, thereby injecting spin polarized carriers into said semiconducting heterostructure for recombination to produce circularly polarized light, wherein said semiconducting heterostructure has at least two semiconducting layers, a first of said at least two semiconducting layers being a p-doped layer and a second of said at least two semiconducting layers being an n-doped or undoped layer.

* * * * *